United States Patent
Shen et al.

(10) Patent No.: US 7,780,862 B2
(45) Date of Patent: Aug. 24, 2010

(54) DEVICE AND METHOD FOR ETCHING FLASH MEMORY GATE STACKS COMPRISING HIGH-K DIELECTRIC

(75) Inventors: Meihua Shen, Fremont, CA (US); Xikun Wang, Sunnyvale, CA (US); Wei Liu, San Jose, CA (US); Yan Du, Santa Clara, CA (US); Shashank Deshmukh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 267 days.

(21) Appl. No.: 11/386,054

(22) Filed: Mar. 21, 2006

(65) Prior Publication Data
US 2007/0224813 A1 Sep. 27, 2007

(51) Int. Cl.
*H01L 21/302* (2006.01)

(52) U.S. Cl. .............. 216/13; 216/67; 216/76; 216/79; 438/715; 438/719; 438/722; 438/738

(58) Field of Classification Search ........... None
See application file for complete search history.

(56) References Cited

U.S. PATENT DOCUMENTS

| | | | |
|---|---|---|---|
| 4,372,807 A | 2/1983 | Vossen, Jr. et al. | |
| 4,375,385 A | 3/1983 | Halon | |
| 4,482,419 A | 11/1984 | Tsukada et al. | |
| 4,563,240 A | 1/1986 | Shibata et al. | |
| 4,618,398 A | 10/1986 | Nawata et al. | |
| 4,680,086 A | 7/1987 | Thomas et al. | |
| 4,842,676 A | 6/1989 | Jucha et al. | |
| 4,855,016 A | 8/1989 | Jucha et al. | |
| 4,897,154 A | 1/1990 | Chakravarti et al. | |
| 4,940,509 A | 7/1990 | Tso et al. | |

(Continued)

FOREIGN PATENT DOCUMENTS

JP 2291131 11/1990

(Continued)

OTHER PUBLICATIONS

Tomoyoshi, English translation of Japanese Patent Abstract for Dry Etching of Barrier Metal/Aluminum Laminated Film; Patent No. JP2291131; Pub. Date Nov. 30, 1990.

(Continued)

*Primary Examiner*—Anita K Alanko
(74) *Attorney, Agent, or Firm*—Blakely Sokoloff Taylor & Zafman LLP

(57) ABSTRACT

In one implementation, a method is provided capable of etching a wafer to form devices including a high-k dielectric layer. The method includes etching an upper conductive material layer in a first plasma chamber with a low cathode temperature, transferring the wafer to a second chamber without breaking vacuum, etching a high-k dielectric layer in the second chamber, and transferring the wafer from the second chamber to the first plasma chamber without breaking vacuum. A lower conductive material layer is etched with a low cathode temperature in the first chamber. In one implementation, the high-k dielectric etch is a plasma etch using a high temperature cathode. In another implementation, the high-k dielectric etch is a reactive ion etch.

11 Claims, 1 Drawing Sheet

U.S. PATENT DOCUMENTS

| | | | |
|---|---|---|---|
| 5,223,453 | A | 6/1993 | Sopori |
| 5,236,537 | A | 8/1993 | Asaka |
| 5,252,181 | A | 10/1993 | Dutartre et al. |
| 5,258,333 | A | 11/1993 | Shappir et al. |
| 5,427,638 | A | 6/1995 | Goetz et al. |
| 5,462,635 | A | 10/1995 | Ono et al. |
| 5,466,636 | A | 11/1995 | Cronin et al. |
| 5,468,679 | A | 11/1995 | Paz De Araujo et al. |
| 5,470,797 | A | 11/1995 | Mastrangelo |
| 5,508,207 | A | 4/1996 | Horai et al. |
| 5,578,133 | A | 11/1996 | Sugino et al. |
| 5,769,952 | A | 6/1998 | Komino |
| 5,786,277 | A | 7/1998 | Yamamoto |
| 5,895,248 | A | 4/1999 | De Boer et al. |
| 5,932,048 | A | 8/1999 | Furukawa et al. |
| 5,933,751 | A | 8/1999 | Hirota |
| 5,968,848 | A | 10/1999 | Tanabe et al. |
| 5,983,907 | A | 11/1999 | Danh et al. |
| 6,010,966 | A | 1/2000 | Ionov |
| 6,077,776 | A | 6/2000 | Cho et al. |
| 6,090,717 | A | 7/2000 | Powell et al. |
| 6,107,192 | A | 8/2000 | Subrahmanyan et al. |
| 6,146,929 | A | 11/2000 | Oana et al. |
| 6,180,505 | B1 | 1/2001 | Uzoh |
| 6,204,087 | B1 | 3/2001 | Parker et al. |
| 6,255,226 | B1 | 7/2001 | Zheng et al. |
| 6,265,749 | B1 | 7/2001 | Gardner et al. |
| 6,277,767 | B1 | 8/2001 | Shiramizu |
| 6,303,505 | B1 | 10/2001 | Ngo et al. |
| 6,329,276 | B1 | 12/2001 | Ku et al. |
| 6,413,863 | B1 | 7/2002 | Liu et al. |
| 6,451,647 | B1 | 9/2002 | Yang et al. |
| 6,500,357 | B1 | 12/2002 | Luo et al. |
| 6,508,920 | B1 | 1/2003 | Ritzdorf et al. |
| 6,511,872 | B1 | 1/2003 | Donnelly et al. |
| 6,511,918 | B2 | 1/2003 | Wege et al. |
| 6,566,148 | B2 | 5/2003 | Hsu et al. |
| 6,566,211 | B2 | 5/2003 | Graas et al. |
| 6,660,647 | B1 | 12/2003 | Ono et al. |
| 6,666,986 | B1 | 12/2003 | Vaartstra |
| 2001/0046738 | A1 * | 11/2001 | Au et al. ............ 438/261 |
| 2002/0005392 | A1 | 1/2002 | Luo et al. |
| 2002/0119669 | A1 * | 8/2002 | Ono et al. ........... 438/710 |
| 2003/0045098 | A1 | 3/2003 | Verhaverbeke et al. |
| 2003/0067023 | A1 * | 4/2003 | Olewine et al. ....... 257/296 |
| 2003/0129847 | A1 | 7/2003 | Celii et al. |
| 2003/0170985 | A1 | 9/2003 | Hwang et al. |
| 2003/0194877 | A1 | 10/2003 | Yau et al. |
| 2004/0007561 | A1 | 1/2004 | Nallan et al. |
| 2004/0011380 | A1 | 1/2004 | Ji et al. |
| 2004/0074869 | A1 | 4/2004 | Wang et al. |
| 2004/0262262 | A1 | 12/2004 | Chiu et al. |
| 2005/0081781 | A1 * | 4/2005 | Lin et al. ............. 117/104 |
| 2005/0118353 | A1 * | 6/2005 | Chen et al. ........... 427/569 |
| 2005/0153563 | A1 | 7/2005 | Ramalingam et al. ... 438/706 |
| 2005/0164479 | A1 * | 7/2005 | Perng et al. ........... 438/591 |
| 2005/0164511 | A1 * | 7/2005 | Chen et al. ........... 438/706 |
| 2005/0176191 | A1 | 8/2005 | Kumar et al. |
| 2005/0215062 | A1 | 9/2005 | Miyagawa et al. |
| 2005/0282341 | A1 | 12/2005 | Park et al. |
| 2007/0042601 | A1 * | 2/2007 | Wang et al. .......... 438/689 |
| 2007/0190795 | A1 * | 8/2007 | Zhuang et al. ........ 438/722 |
| 2007/0231986 | A1 * | 10/2007 | Shin .................... 438/197 |
| 2007/0238302 | A1 * | 10/2007 | Dip et al. ............. 438/706 |
| 2007/0249182 | A1 * | 10/2007 | Mani et al. ........... 438/785 |

FOREIGN PATENT DOCUMENTS

| | | |
|---|---|---|
| JP | 6151383 | 5/1994 |
| KR | 20040103453 | 12/2004 |

OTHER PUBLICATIONS

USPTO Office Action dated Apr. 1, 2009 for U.S. Appl. No. 11/208,573.

USPTO Office Action dated Jul. 29, 2008 for U.S. Appl. No. 11/208,573.

USPTO Office Action dated Jun. 12, 2007 for U.S. Appl. No. 11/208,573.

USPTO Office Action dated Sep. 28, 2006 for U.S. Appl. No. 11/208,573.

* cited by examiner

DEVICE AND METHOD FOR ETCHING FLASH MEMORY GATE STACKS COMPRISING HIGH-K DIELECTRIC

BACKGROUND

Integrated circuits (IC) play a significant role in the field of modern semiconductor technology. The development of integrated circuits has made possible a modern world with advanced electrical technology. Applications of integrated circuits are so widespread and their significance affects our every day lives from cellular phones, digital televisions, to flash memory chips in cameras. These integrated circuits typically are formed on silicon substrates or wafers, which can include active semiconductor devices with structured processes for a wide range of stacked layers made from different materials, allowing for memory capabilities.

Recently, in modern semiconductor technology, integrated circuits have advanced towards smaller devices with more memory. In the manufacture of semiconductor integrated circuits (IC), typically, dielectric materials such as silicon dioxide ($SiO_2$), silicon nitride ($Si_3N_4$) and silicon oxynitride (SiON) have been widely used. However, as technology has progressed, IC device geometry has become smaller, resulting in progressively thinner integrated circuit devices. When typical IC devices approach thicknesses of a few nanometers or less, conventional aforementioned dielectric materials can typically undergo electronic breakdown and can no longer provide the memory storage needed.

To address the aforementioned problems, high dielectric constant materials (high k dielectric materials) have been used in semiconductor chip manufacturing with their potential application in memory devices, such as flash memory. A conventional flash memory film stack consists of poly 2 (control gate)/ONO (interpoly dielectric)/poly 1 (floating gate) gate oxide. One of the key changes in the gate film stack at 65 nanometer node and beyond, for flash memory applications, is the replacement of the ONO inter-poly dielectric film with a high-k material. Examples of high-k materials include aluminum oxide, ($Al_2O_3$), hafnium oxide ($HfO_x$), zirconium oxide ($ZrO_x$), titanium oxide ($TiO_x$), and mixtures thereof, and metal silicates such as $HfSi_xO_y$, $ZrSiO_4$ and mixtures thereof.

Because of the different composition and reduced size of the high-k dielectric flash memory stack, processing can not be efficiently carried out with conventional etch chamber processing. Therefore, what is needed is an etch chamber and processing methods designed for efficient processing of high-k dielectric flash memory stacks.

SUMMARY

In one implementation, a method is provided for multi-chamber plasma etching to form high-k dielectric flash memory devices on a wafer. The method includes etching an upper conductive material layer in a first plasma chamber with a cathode temperature below about 100 degrees Celsius to define a control gate and transferring the wafer from the first chamber to a hot cathode chamber without breaking vacuum. In the hot cathode chamber, plasma etching is performed of a high-k dielectric layer with a temperature between about 100 and about 300 degrees Celsius. The wafer is transferred from the hot cathode chamber to the first plasma chamber without breaking vacuum. In the first plasma chamber a lower polysilicon layer is etched with a cathode temperature below about 100 degrees Celsius to define a floating gate electrode.

In one implementation, a method for etching a wafer to form high-k dielectric flash memory devices is provided. The method includes etching an upper conductor layer in a first plasma chamber to define a control gate. The wafer is transferred from the first plasma chamber to a reactive ion etch chamber without breaking vacuum. A high-k dielectric layer is etched with a reactive ion etch process, and the wafer is transferred back to the first plasma chamber without breaking vacuum. In the first plasma chamber, a lower polysilicon layer is etched to define a floating gate electrode.

In one implementation a method is provided capable of etching a wafer to form devices including a high-k dielectric layer. The method includes etching an upper conductive material layer in a first plasma chamber with a low cathode temperature and transferring the wafer from the first plasma chamber to a second chamber without breaking vacuum. The high-k dielectric layer is etched in the second chamber. After etching the high-k dielectric layer, the wafer is transferred from the second chamber to the first plasma chamber without breaking vacuum. In the first plasma chamber a lower conductive material layer is etched with a low cathode temperature. In one implementation, the high-k dielectric etch is performed with a plasma using a high temperature cathode. In another implementation, the high-k dielectric etch is performed with a reactive ion etch.

In one embodiment, an integrated etch station is provided for etching of a flash memory high-k gate stack having a control gate and a floating gate, with a high-k dielectric between them. The integrated etch chamber includes a first plasma chamber capable of etching to define the control gate and the floating gate of the flash memory stack. The first plasma chamber is configured to etch in a temperature range of less than about 100 degrees Celsius. A second chamber is configured to etch the high-k dielectric. A vacuum transfer chamber is coupled between the first plasma chamber and the second chamber, the vacuum transfer chamber includes a wafer transport means for transporting wafers between the first plasma chamber and the second chamber. In some embodiments, the second chamber is a high temperature plasma etch chamber configured to etch in a temperature range of from about 100 degrees Celsius to about 300 degrees Celsius. In other embodiments, the second chamber is a reactive ion etch chamber configured to etch the high-k dielectric.

DESCRIPTION

Figure 1:
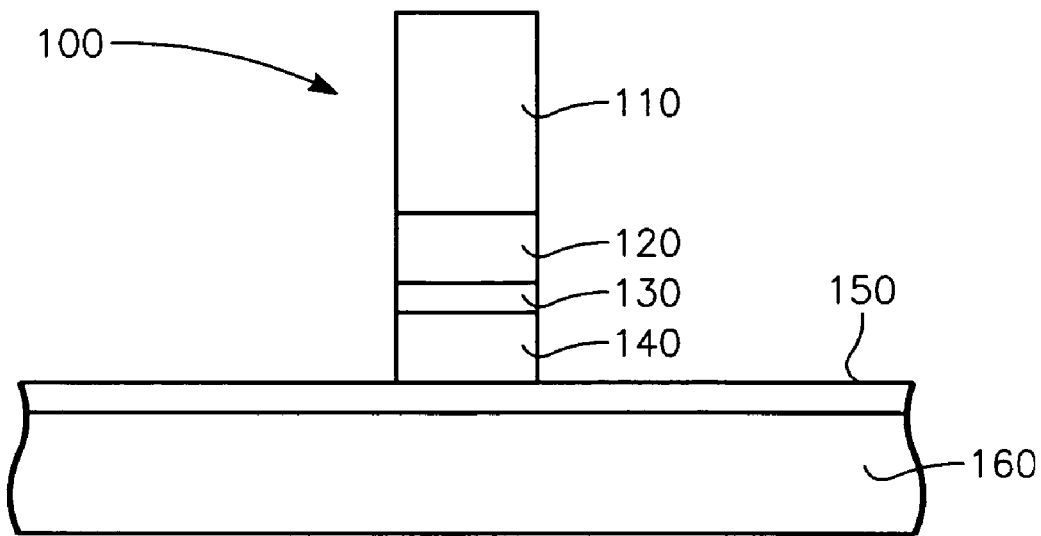
FIG. 1 shows a simplified example of an etched flash memory stack on a substrate.

FIG. 1 shows a simplified example of an etched flash memory stack 100 on a substrate 160. A hardmask 110 in an etch process to define the stack 100. A high-k dielectric 130 is located between a control gate 120 and a floating gate 140. The control gate 120 and the floating gate 140 may be etched from polysilicon layers, or layers of other conducting material (not shown). The high-k dielectric 130 is defined from a layer (not shown) of high-k dielectric material after the control gate 120 is defined. A gate oxide 150 is between the floating gate 140 and the substrate 160. The stack 100 may include additional layers, not shown, such as barrier layers, etch stop layers, or the like.

A conventional ONO-based flash memory gate stack is etched in a chamber like a DPSII poly etcher, manufactured by Applied Materials, Inc., of Santa Clara, Calif., at temperatures between 40-85 degrees Celsius. The temperature requirement primarily is driven by need to etch polysilicon with tight profile and critical dimension control.

Unlike ONO ($SiO_2$/SiN/$SiO_2$ sandwich) films, high-k material films such as $Al_2O_3$ and $HfO_x$, for example, are very difficult to etch at temperatures below 100 degrees Celsius because the etch byproducts are non-volatile. Hence it is not practical to carry out the complete gate etch for high-k based flash memory stacks 100 in a single low temperature chamber.

Figure 2:
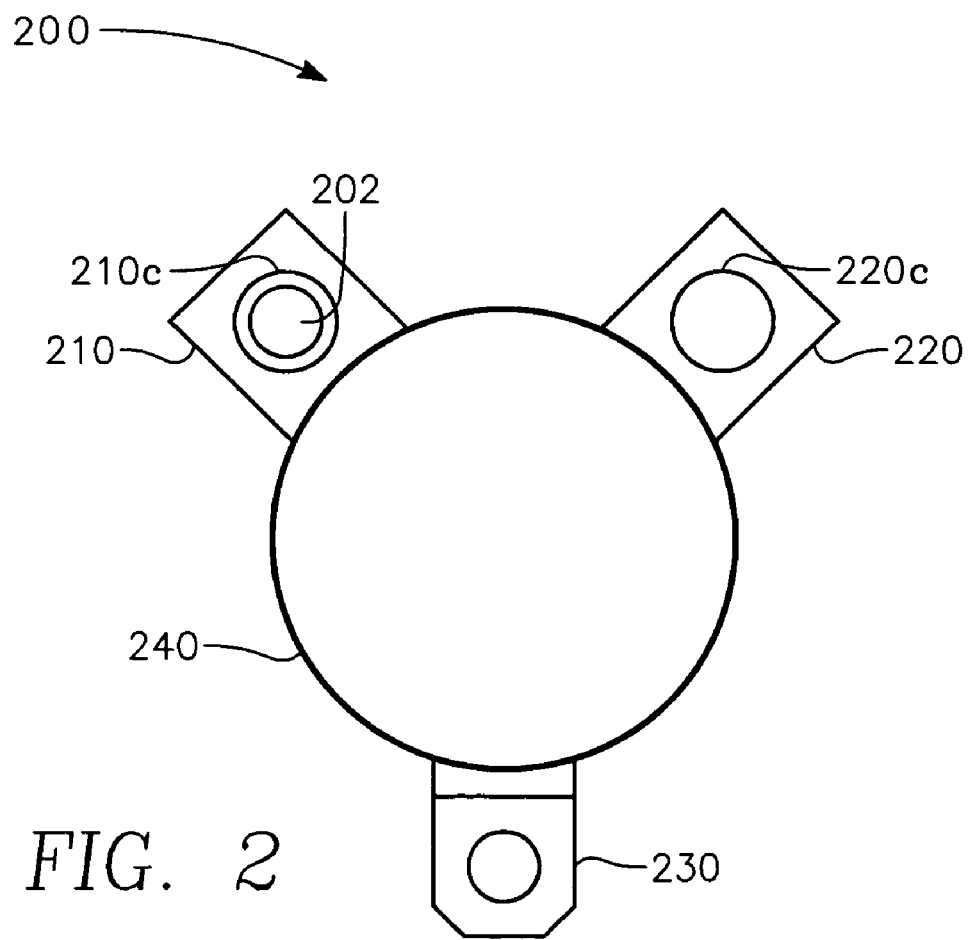
FIG. 2 shows a simplified illustration of a two chamber etch system for etching a high-k flash memory stack.

FIG. 2 shows a simplified illustration of a two chamber etch system 200 for etching a high-k flash memory stack. Referring to FIGS. 1 and 2, in a first chamber 210 an etch is performed with a cathode 210c at a temperature below about 100 degrees Celsius to define a control gate 120 from a poly 2 layer or other conducting layer. The etch is stopped at the high-k dielectric material. The first chamber 210 may be a DPSII etch chamber available from Applied Materials, Inc.

The wafer 202 is transported through a vacuum transport chamber 240, which typically has a wafer transport means such as a robotic arm (not shown), to a second chamber 220, where a high-k dielectric etch is performed. This process is typically controlled by a microprocessor (not shown). In the second chamber 220 the high-k dielectric etch is performed using a hot cathode 220c with a temperature in a range from about 100 degrees Celsius to about 300 degrees Celsius. In some implementations, the high-k dielectric etch is performed using a hot cathode 220c with a temperature in a range from about 250 degrees Celsius to about 300 degrees Celsius. The high-k etch defines the high-k dielectric 130 shown in FIG. 1. In the second etch chamber 220, the high-k material film may be etched with up to 700% over etch. A DPSII-HT, available from Applied Materials, Inc., or other comparable etch chamber may be used to perform the high-k dielectric etch.

In another embodiment, the second etch chamber 220 is a reactive ion etch or RIE chamber, which is used to perform an ion bombardment assisted chemical etch of the high-k material. Such an etch may be performed at less than 100 degrees Celsius, if desired.

In one example implementation, a high-k material such as $Al_2O_3$ may be etched with a reactant mixture having $BCl_3$ and a hydrocarbon passivation gas such as $C_2H_4$, with a diluent of He, as disclosed in U.S. patent application Ser. No. 11/208, 573, by Wang et al., entitled METHOD FOR ETCHING HIGH DIELECTRIC CONSTANT MATERIALS, filed Aug. 22, 2005, herein incorporated by reference in its entirety. In one implementation, a high temperature etch at greater than about 150 degrees Celsius may be used with a $BCl_3$ based chemistry, to provide high selectivity, with a near vertical $Al_2O_3$ interface and virtually no control gate poly attack. Thus, a greater than 1.5 to 1 selectivity between the $Al_2O_3$ and poly during the $Al_2O_3$ etch is possible. In another example, a high-k material such as hafnium oxide may be etched using 250 degrees Celsius, or higher.

After etching the high-k dielectric 130, the wafer 202 is returned back to the first chamber 210 to complete etching of the floating gate 140. The etch is stopped on the gate oxide 150. The floating gate 140 may be a poly 1 or other conducting material.

Various embodiments may provide one or more advantages in high-k flash memory processing. Using a separate chamber for the high-k dielectric etch allows high temperature etching by forming volatile etch byproducts. For example, $CF_4$, $C_2F_6$, $CHF_3$ chemistries can provide high etch selectivity in conventional processing. When used to etch high-k materials, these etchant gases combine to form non-volatile compounds, such as $AlF_3$ in the case of $Al_3O_2$ high-k dielectric. Thus, another chemistry that forms volatile etch byproducts, such as Cl, could be used to etch the high-k material.

Further, by using separate chambers for the control and/or floating gate 120 and 140 etch, and the high-k dielectric 130, it is easier to maintain consistent chamber conditions and wall effects from wafer to wafer, enabling volume production. Moreover, using separate chambers for the etching of flash memory stacks allows different plasma generation sources for the two chambers, one optimized for etching gate materials and the other for etching high-k dielectric materials. In contrast, etching the entire flash memory stack 100 in a single chamber can produce undesirable etch byproducts. For example, etching a high-k film of $Al_2O_3$ and a gate electrode film of polysilicon in the same chamber can result in Al and Si based etch byproducts in the chamber. Keeping a single chamber clean to achieve consistent chamber performance and a high mean wafer between cleaning or MWBC rate is not easy in a single chamber. Using different chambers for etching the high-k material and the gate material limits the types of byproducts, so improves process consistency and the MWBC rate. By using a separate first chamber 210 for the polysilicon for example, a standard clean process may be used in the first chamber 210, and a different clean process may be used for the high-k dielectric byproducts in the second chamber 220, depending on the particular byproduct.

The high temperature for the high-k dielectric plasma etch in the second chamber 220, about 100 to about 300 degrees Celsius, allows the high-k dielectric material to be etched faster than in a conventional low temperature plasma chamber. Further, at high temperature, the etch byproduct is more volatile, without causing much change in the etch rate of polysilicon. Thus, the selectivity to polysilicon is high, allowing use of an over etch of the high-k material of up to about 700%, or even greater than about 700%.

Although shown with one chamber 210 for gate etching and one chamber 220 for high-k dielectric etch, in some embodiments additional gate etch chambers and/or high-k dielectric etch chambers may be used. Further, although the above description is made with reference to etching of flash memory, embodiments and implementations of the present invention are applicable to processing of any multilayer stack including high-k dielectric material, and where both low and high temperature plasma etch processes are desirable, or where a low temperature plasma etch combined with a reactive ion etch is beneficial.

While the invention herein disclosed has been described by the specific embodiments and implementations, numerous modifications and variations could be made thereto by those skilled in the art without departing from the scope of the invention set forth in the claims.

What is claimed is:

1. A method for multi-chamber plasma etching to form high-k dielectric flash memory devices on a wafer, the method comprising:
   a) etching an upper conductive material layer in a first plasma chamber with a cathode temperature below about 100 degrees Celsius to define a control gate;
   b) transferring the wafer from the first plasma chamber to a hot cathode chamber without breaking vacuum;
   c) etching a high-k dielectric layer with a plasma using a $BCl_3$ and hydrocarbon passivation gas in the hot cathode chamber with a temperature in a range from about 100 degrees Celsius and to about 300 degrees Celsius so as to allow up to 700% overetch of the high-k dielectric layer in the hot cathode chamber;

d) transferring the wafer from the hot cathode chamber to the first plasma chamber without breaking vacuum; and e) etching a lower polysilicon layer in the first plasma chamber with a cathode temperature below about 100 degrees Celsius to define a floating gate electrode.

2. The method of claim 1, wherein etching the high-k material layer comprises plasma etching with a cathode temperature in a range above about 150 degrees Celsius.

3. The method of claim 2, wherein etching the high-k material layer comprises plasma etching with a cathode temperature in a range above about 250 degrees Celsius.

4. The method of claim 1, wherein etching the upper conductive material layer comprises etching least one of: (a) polysilicon layer; or (b) a metal comprising layer.

5. The method of claim 1, wherein etching the upper conductive material layer comprises etching at least one layer comprising: (a) polysilicon; (b) tungsten; (c) tungsten nitride; or (d) tungsten silicide.

6. The method of claim 1, wherein etching the high-k material layer comprises etching with a cathode temperature above about 250 degrees Celsius.

7. The method of claim 6, wherein etching the lower polysilicon layer comprises etching the lower polysilicon layer with a cathode temperature below about 80 degrees Celsius.

8. The method of claim 7, wherein etching the upper conductive material layer comprises etching polysilicon with a cathode temperature below about 80 degrees Celsius.

9. A method capable of etching a wafer to form devices including a high-k dielectric layer, the method comprising:

a) etching an upper conductive material layer in a first plasma chamber with a low cathode temperature;

b) transferring the wafer from the first plasma chamber to a second chamber without breaking vacuum;

c) etching the high-k dielectric layer in the second chamber using a $BCl_3$ and a hydrocarbon passivation gas with the cathode temperature between about 100 degrees Celsius and about 300 degrees Celsius in the second chamber including an over etch step in the hot cathode chamber so as to allow about 700% over etch of the high-k dielectric layer in the hot cathode chamber;

d) transferring the wafer from the second chamber to the first plasma chamber without breaking vacuum after etching the high-k dielectric layer; and e) etching the lower conductive material layer in the first plasma chamber with a low cathode temperature comprising etching a polysilicon layer to a gate oxide layer using the low cathode temperature to define a floating gate.

10. The method of claim 1, wherein etching a high-k dielectric layer in the hot cathode chamber comprises etching the high-k dielectric layer with greater than about 700% over etch in the hot cathode chamber.

11. The method of claim 1, wherein etching a high-k dielectric layer in the hot cathode chamber comprises etching the high-k dielectric layer with greater than about 700% over etch in the hot cathode chamber.

* * * * *

UNITED STATES PATENT AND TRADEMARK OFFICE
CERTIFICATE OF CORRECTION

PATENT NO. : 7,780,862 B2  Page 1 of 1
APPLICATION NO. : 11/386054
DATED : August 24, 2010
INVENTOR(S) : Meihua Shen et al.

It is certified that error appears in the above-identified patent and that said Letters Patent is hereby corrected as shown below:

Column 6, line 8 please delete "~~$BCl_3$~~" and insert --$BCl_3$--

Signed and Sealed this
Fifth Day of June, 2012

David J. Kappos
*Director of the United States Patent and Trademark Office*